United States Patent
Gonzalez Jimenez

(10) Patent No.: US 9,813,228 B2
(45) Date of Patent: *Nov. 7, 2017

(54) DEVICE AND METHOD FOR EMITTING AND/OR RECEIVING SIGNALS IN AT LEAST TWO SYMMETRICAL TRANSMISSION FREQUENCY BANDS

(71) Applicant: Commissariat A L'Energie Atomique et aux Energies Alternatives, Paris (FR)

(72) Inventor: Jose-Luis Gonzalez Jimenez, Voreppe (FR)

(73) Assignee: Commissariat à l'énergie atomique et aux énergies alternatives, Paris (FR)

(*) Notice: Subject to any disclaimer, the term of this patent is extended or adjusted under 35 U.S.C. 154(b) by 125 days.

This patent is subject to a terminal disclaimer.

(21) Appl. No.: 14/709,638

(22) Filed: May 12, 2015

(65) Prior Publication Data
US 2015/0341162 A1  Nov. 26, 2015

(30) Foreign Application Priority Data

May 20, 2014  (FR) ..................... 14 54520

(51) Int. Cl.
*H04L 7/033*  (2006.01)
*H04W 56/00*  (2009.01)
(Continued)

(52) U.S. Cl.
CPC ........... *H04L 7/033* (2013.01); *H04B 1/0057* (2013.01); *H04B 1/403* (2013.01); *H04W 56/001* (2013.01); *H04B 1/525* (2013.01)

(58) Field of Classification Search
CPC ....... H04L 7/033; H04B 1/0057; H04B 1/403; H04W 56/001
See application file for complete search history.

(56) References Cited

U.S. PATENT DOCUMENTS 4,287,480 A * 9/1981 Swift ...................... H03L 7/085
  331/1 A
4,627,079 A * 12/1986 von der Embse .. H04L 25/4904
  324/76.21
(Continued)

OTHER PUBLICATIONS

French Preliminary Search Report issued Mar. 4, 2015 in French Application 14 54520, filed on May 20, 2014 (with English Translation of Categories of Cited Documents).
(Continued)

*Primary Examiner* — Noel Beharry
*Assistant Examiner* — Rodrick Mak
(74) *Attorney, Agent, or Firm* — Oblon, McClelland, Maier & Neustadt, L.L.P.

(57) ABSTRACT

Device for emitting-receiving signals in two symmetrical frequency bands in relation to a first frequency $F_{CA}$ and such that each one of the bands comprises symmetrical channels in relation to second frequencies $F_{CLA}$, $F_{CUA}$, comprising:
 a first circuitry generating a signal of frequency $F_A$, a signal of frequency $F_B = F_A/N1$, a signal of frequency $F_1 = |F_{CA} - F_{CLA}|$ and a periodic signal of frequency $F_2$ equal to the difference between a central frequency of one of the channels and the associated second frequency, and wherein $F_A = N1 \cdot (F_{CLA} + F_1)/(N1+1)$;
 a second circuitry able to carry out non-linear operations between the signals of frequencies $F_A$ and $F_1$ and those of frequencies $F_B$ and $F_2$, generating multitone signals comprising the frequencies $F_A - F_1$, $F_A + F_1$, $F_B - F_2$ and $F_B + F_2$.

15 Claims, 6 Drawing Sheets

(51) Int. Cl.
*H04B 1/403* (2015.01)
*H04B 1/00* (2006.01)
*H04B 1/525* (2015.01)

(56) References Cited

U.S. PATENT DOCUMENTS

| | | | |
|---|---|---|---|
| 5,852,603 A | 12/1998 | Lehtinen et al. | |
| 6,163,568 A * | 12/2000 | Lansford | H04B 1/403 375/219 |
| 6,522,177 B1 * | 2/2003 | Spampinato | H03B 21/01 327/105 |
| 2002/0023239 A1 * | 2/2002 | Nomura | H03L 7/183 713/500 |
| 2002/0183030 A1 * | 12/2002 | Damgaard | H03D 7/163 455/258 |
| 2009/0156150 A1 | 6/2009 | Deleon | |
| 2011/0080528 A1 | 4/2011 | Deleon | |

OTHER PUBLICATIONS

Oded Katz et al. "A fully integrated SiGe E-BAND Transceiver chipset for broadband point-to-point communication", Radio and Wireless Symposium, 2012, 4 pages.

Olivier Richard et al. "A 17.5-to-20.94GHz and 35-to-41.88GHz PLL in 65nm CMOS for Wireless HD Applications", Solid-State Circuits Conference Digest of Technical Papers (ISSCC), 2010, 3 pages.

Marc Tiebout "A 50 GHz direct injection locked oscillator topology as low power frequency divider in 0.13 μm CMOS", Solid-State Circuits Conference, 2003, 4 pages.

Electronic Communications Committee (ECC), "Radio Frequency Channel Arrangements for Fixed Service Systems Operating in the Bands 71-76 GHz and 81-86 GHz", Electronics Communications Committee, ECC Recommendation, 2013, 13 pages.

* cited by examiner

DEVICE AND METHOD FOR EMITTING AND/OR RECEIVING SIGNALS IN AT LEAST TWO SYMMETRICAL TRANSMISSION FREQUENCY BANDS

TECHNICAL FIELD AND PRIOR ART

The invention relates to the field of transmitting and/or receiving devices, and in particular that of integrated wireless transmitting and/or receiving devices that make use of frequency-stable periodic signals in order to carry out one or several signal frequency transpositions in the transmitting part and/or the receiving part of these devices, for example in order to carry out an emitting and a receiving of signals in at least two different transmission frequency bands. The invention relates in particular to a device and a method making it possible to generate frequency-stable periodic signals with a reduced number of local oscillators thanks to the use of the symmetry properties of the frequency bands used.

The invention is advantageously used in transmitting and/or receiving devices of the FDD type ("Frequency Division Duplexing") and/or with multichannel architecture, for example of the E-Band type.

A frequency synthesis device makes it possible to supply a frequency stable periodic signal intended to be used for example in a radio frequency (RF) communication system. During an emitting of signals, a signal containing the information to be sent is modulated with the frequency stable periodic signal serving as a carrier signal in order to convey this information. The frequency synthesis carried out defines in this case the value of the emission carrier frequency. During a receiving of signals, the frequency synthesis makes it possible to supply this frequency stable periodic signal in order to demodulate the information received. The frequency stable periodic signal can also be used to perform a transposition of frequencies between the baseband and intermediate frequencies, and/or between the intermediate frequencies and the transmitting and receiving carrier frequencies.

Frequency-stable periodic signals are generally generated by local oscillators within frequency generators of the PLL type (phase locked loop). In certain cases, the emitting-receiving devices require at least two different frequency-stable signals, one for the emitting part and the other for the receiving part, with these two signals having to be supplied simultaneously by the frequency generator. In addition, if the emitting-receiving device comprises several parallel emitting-receiving channels, several frequency-stable periodic signals and having different frequencies are generally required simultaneously by the different channels.

In the case of an emitting-receiving device of the E-Band type, two transmission frequency bands of a width equal to 5 GHz and localised around 70 GHz (71-76 GHz) and 80 GHz (81-86 GHz) are used, one for emitting and the other for receiving signals. In addition, such a device must be able to permute these two frequency bands for emission and reception. Such a device is generally carried out by making use of a first frequency conversion stage comprising a mixer using a first high-frequency signal.

The document U.S. Pat. No. 5,852,603 describes an emitting-receiving device of the FDD type wherein two frequency-stable signals are generated for a first conversion stage by a frequency synthesis device. In this device, the frequencies generated have fixed values and cannot be permuted between the transmitting part and the receiving part of the device.

The document by O. Katz and al., "A fully integrated SiGe E-BAND transceiver chipset for broadband point-to-point communication", Radio and Wireless Symposium (RWS), 2012 IEEE, pages 431-434, Jan. 15-18, 2012, describes an emitting—receiving device of the FDD type adapted to the E-Band communication standard. In order to be able to simultaneously carry out an emitting and a receiving of signals in the two different transmission frequency bands and in order to be able to permute these two bands, two separate signal generators of the PLL type as well as a device that makes it possible to permute the sending of the output signals of these two generators in the emission and reception portions are used.

Calling upon several separate signal generators is an expensive and cumbersome solution and which consumes a lot of electrical energy. In addition, in such a device, the duration in order to carry out the permutation of the emission and reception frequency bands depends on the duration of locking of the PLL, and this duration can be excessively long for certain applications.

In addition, the two transmission frequency bands are divided into several channels, or sub-bands, as described in the document "RADIO FREQUENCY CHANNEL ARRANGEMENTS FOR FIXED SERVICE SYSTEMS OPERATING IN THE BANDS 71-76 GHz AND 81-86 GHz", Electronic Communications Committee (ECC), May 2013. These channels are centred on different frequencies according to the width of each channel and are sometimes distributed nonuniformly within transmission frequency bands. In this case, it is necessary to use, for transpositions of frequencies, periodic signals of different frequencies which are not uniformly spaced apart from one another.

For example, each one of the transmission frequency bands 71-76 GHz and 81-86 GHz can be uniformly divided into 19 channels 250 MHz wide, by retaining guard bands of 125 MHz at the ends of the transmission frequency bands. The channels have in this case consecutive central frequencies uniformly spaced apart from one another. It is also possible that the channels be wider, for example with widths between 500 MHz and 4500 MHz, for TDD ("Time Division Duplexing") and FDD cross-band applications. For the FDD applications, the emitter operates for example in the low frequency transmission band (71-76 GHz) and the receiver in the high frequency transmission band (81-86 GHz). In most cases, the channels used for emitting and for receiving are symmetrical, i.e. have similar widths in the high and low frequency transmission bands, and therefore the two transmission frequency bands are divided in the same way.

In the example hereinabove, when the channels have a width greater than 500 MHz, the central frequencies of these channels are not consecutive for all of the channels in the high and low frequency transmission bands, which implies that the numerical relationships between the values of the central frequencies of the channels are different. The frequency transposition in these channels is therefore complex, in particular when these different frequencies must be obtained simultaneously using a single reference frequency via integral or fractional frequency multipliers or dividers. The frequency synthesis device used is in particular complexified when several frequencies have to be generated simultaneously and when the relationships between these frequencies are not low integer values.

For example, for channels of a width equal to 1 GHz, the central frequencies of these channels in the low frequency transmission band 71-76 GHz are equal to 71.825 GHz, 72.625 GHz, 74.125 GHz and 75.125 GHz. Their greatest common divisor is 125 MHz but their multiplication factors are 574, 581, 593 and 601, of which the last two integers are prime numbers.

DISCLOSURE OF THE INVENTION

Thus there is a need to propose a new type of device for emitting and/or receiving signals intended to be transmitted in at least two symmetrical transmission frequency bands that does not have the disadvantages of the devices of prior art mentioned hereinabove, and making it possible to generate several frequency-stable periodic signals without using as many local oscillators as signals intended to be generated, in particular when the central frequencies of these signals are not consecutive.

For this, one embodiment proposes a device for emitting and/or receiving signals intended to be transmitted in at least two symmetrical transmission frequency bands in relation to a first frequency of symmetry $F_{CA}$ and such that each one of the two transmission frequency bands comprises at least two channels, or groups of channels, symmetrical in relation to second frequencies of symmetry $F_{CLA}$, $F_{CUA}$, comprising at least:
- a first circuitry, or first means, able to generate a periodic signal of frequency $F_A$, a periodic signal of frequency $F_B = F_A/N1$, a periodic signal of frequency $F_1$ equal to $|F_{CA} - F_{CLA}|$ and a periodic signal of frequency $F_2$ equal to the difference between a central frequency of one of the channels or groups of channels and the second frequency of symmetry associated with said one of the channels or groups of channels, and wherein $F_A = N1 \cdot (F_{CLA} + F_1)/(N1+1)$ with N1 a number greater than 1;
- a second circuitry, of second means, able to carry out a first non-linear operation between the periodic signals of frequencies $F_A$ and $F_1$ generating a first multitone signal of which the frequency spectrum comprises two main lines at frequencies $F_A - F_1$ and $F_A + F_1$, and able to carry out a second non-linear operation between the periodic signals of frequencies $F_B$ and $F_2$ generating a second multitone signal of which the frequency spectrum comprises two main lines at frequencies $F_B - F_2$ and $F_B + F_2$.

Such a device astutely therefore uses the symmetries between the transmission frequency bands and between the channels in order to generate multitone signals of which the frequency spectrums comprise main lines at particular frequencies making it possible to generate, using these multitone signals, for example via frequency filtering or recoveries, frequency-stable periodic signals adapted to transpositions of frequencies intended to be carried out by the emitting and/or receiving device. Such a device therefore avoids having to use several local oscillators to generate these frequency-stable periodic signals as well as specific looping and stabilising structures (PLL) for each one of the signals.

The frequency $F_1$ can also be expressed as being equal to $|F_{CA} - F_{CUA}|$. In addition, the frequency $F_A$ can also be expressed as being such that $F_A = N1 \cdot (F_{CUA} - F_1)/(N1+1)$.

The first multitone signal can be used for the generating of frequency-stable periodic signals used for a transposition of frequencies between the RF frequencies and intermediate frequencies, and the second multitone signal can be used for the generating of frequency-stable periodic signals used for a transposition of frequencies between the intermediate frequencies and low frequencies such as the baseband. The periodic signals generated are all phase synchronised due to the fact that they are generated using the same signal.

In multitone signals, the main lines are those that have the greatest amplitudes among all of the spectral lines within the frequency spectrum of each signal.

The device can correspond to a point-to-point communication device of the multichannel or single-channel E-band type.

The device can correspond to a system of the FDD type that uses several periodic signals of different frequencies and which makes it possible to permute the emission and reception frequency bands, particularly in the case of multiple channels of central frequencies nonuniformly distributed in the emission and reception frequency bands but having a symmetry between them.

The invention relates for example to a device for transmitting RF or electro-optical signals.

N1 is advantageously an integer greater than 1, in particular when the periodic signals of frequencies $F_A$ and $F_B$ are generated from the same PLL using one or several frequency dividers that apply an integer divider ratio.

The second circuitry may comprise at least one first mixer able to carry out the first non-linear operation and a second mixer able to carry out the second non-linear operation.

The first circuitry may comprise a first phase locked loop able to output the periodic signals of frequencies $F_A$ and $F_B$ and a second phase locked loop able to output the periodic signals of frequencies $F_1$ and $F_2$, or, when the frequency $F_A$ corresponds to an integer multiple of each one of the frequencies $F_B$, $F_1$ and $F_2$, the first circuitry comprises a single phase locked loop able to output the periodic signals of frequencies $F_A$, $F_B$, $F_1$ and $F_2$.

Such a device may advantageously comprise a number of PLL less than the number of channels used, and even a single PLL.

The device may further comprise at least:
- first and second frequency recovery circuits receiving as input the first multitone signal and each one outputting a periodic signal respectively of frequency $F_A - F_1$ and $F_A + F_1$;
- third and fourth frequency recovery circuits receiving as input the second multitone signal and each one outputting a periodic signal respectively of frequency $F_B - F_2$ and $F_B + F_2$.

In this case, the device may further comprise, when each one of the two transmission frequency bands comprises at least two groups of at least two channels, a third circuitry, or third means, able to perform a third non-linear operation between the periodic signal of frequency $F_B - F_2$ and a periodic signal of frequency $F_3$ generating a third multitone signal of which the frequency spectrum comprises two main lines at frequencies $F_B - F_2 - F_3$ and $F_B - F_2 + F_3$, and able to perform a fourth non-linear operation between the periodic signals of frequencies $F_B + F_2$ and $F_3$ generating a fourth multitone signal of which the frequency spectrum comprises two main lines at frequencies $F_B + F_2 - F_3$ and $F_B + F_2 + F_3$.

In this case, the device may further comprise at least:
- fifth and sixth frequency recovery circuits receiving as input the third multitone signal and each one outputting a periodic signal respectively of frequency $F_B - F_2 - F_3$ and $F_B - F_2 + F_3$;
- seventh and eighth frequency recovery circuits receiving as input the fourth multitone signal and each one outputting a periodic signal of frequency $F_B + F_2 - F_3$ and $F_B + F_2 + F_3$.

Each frequency recovery circuit may comprise at least one injection locked oscillator (ILO) and/or a bandpass filter. It can be advantageous to use one or several ILOs when, for high frequencies such as those used in a device of the E-Band type, the frequency of the periodic signal intended to be outputted corresponds to a line of the frequency spectrum of the multitone signal which is close to one or several other lines of this frequency spectrum. The ILO or ILOs used then have a resonance frequency close to said frequency to be recovered so that they can be locked onto the latter and reject the frequency of the other line or lines of the frequency spectrum. The value of the frequency whereon an ILO is locked is in particular according to a value of a control voltage intended to be applied as input of the ILO. When bandpass filters are used, these filters advantageously have a filtering central frequency centred on the frequency intended to be recovered.

Alternatively, the device may further comprise:
first and second frequency recovery circuits receiving as input the first multitone signal and each one outputting a periodic signal respectively of frequency $F_A-F_1$ and $F_A+F_1$;
a fourth circuitry, or fourth means, able to perform a third non-linear operation between the second multitone signal and a periodic signal of frequency $F_3$ generating a fifth multitone signal of which the spectrum comprises four main lines at the frequencies $F_B-F_2-F_3$, $F_B-F_2+F_3$, $F_B+F_2-F_3$ and $F_B+F_2+F_3$;
at least one switchable injection locked oscillator receiving as input the fifth multitone signal and outputting at least one periodic signal of frequency equal to one of the frequencies $F_B-F_2-F_3$, $F_B-F_2+F_3$, $F_B+F_2-F_3$ and $F_B+F_2+F_3$.

The device may further comprise:
a conversion stage between the transmission frequency bands and a band of intermediate frequencies, comprising at least one third mixer able to receive as input a signal received by the device in one of the two transmission frequency bands and one of the two periodic signals of frequencies $F_A-F_1$ and $F_A+F_1$ and at least one fourth mixer able to receive as input an intermediate frequency band signal intended to be emitted by the device in the other of the two transmission frequency bands and the other of the two periodic signals of frequencies $F_A-F_1$ and $F_A+F_1$;
a conversion stage between the intermediate frequency band and a baseband, comprising a plurality of fifth mixers each able to receive as input an output signal of the third mixer and one of the periodic signals of frequencies $F_B-F_2$, $F_B+F_2$, $F_B-F_2-F_3$, $F_B-F_2-F_3$, $F_B+F_2-F_3$ and $F_B+F_2+F_3$, and a plurality of sixth mixers each able to receive as input a signal in baseband intended to be emitted by the device in said other of the two transmission frequency bands and one of the periodic signals of frequencies $F_B-F_2$, $F_B+F_2$, $F_B-F_2-F_3$, $F_B-F_2+F_3$, $F_B+F_2-F_3$ and $F_B+F_2+F_3$.

Another embodiment relates to a method for emitting and/or receiving signals in at least two symmetrical transmission frequency bands in relation to a first frequency of symmetry $F_{CA}$ and such that each one of the two transmission frequency bands comprises at least two channels, or groups of channels, symmetrical in relation to second frequencies of symmetry $F_{CLA}$, $F_{CUA}$, comprising at least the steps of:
generating a periodic signal of frequency $F_A$, a periodic signal of frequency $F_B=F_A/N1$, a periodic signal of frequency $F_1$ equal to $|F_{CA}-F_{CLA}|$ and a periodic signal of frequency $F_2$ equal to the difference between a central frequency of one of the channels or group of channels and the second frequency of symmetry associated with said one of the channels or group of channels, and wherein $F_A=N1 \cdot (F_{CLA}+F_1)/(N1+1)$ with N1 a number greater than 1;
performing of a first non-linear operation between the periodic signals of frequencies $F_A$ and $F_1$ generating a first multitone signal of which the frequency spectrum comprises two main lines at frequencies $F_A-F_1$ and $F_A+F_1$, and a second non-linear operation between the periodic signals of frequency $F_B$ and $F_2$ generating a second multitone signal of which the frequency spectrum comprises two main lines at frequencies $F_B-F_2$ and $F_B+F_2$.

The method may further comprise the steps of:
generating periodic signals of frequencies $F_A-F_1$ and $F_A+F_1$ using the first multitone signal;
generating periodic signals of frequencies $F_B-F_2$ and $F_B+F_2$ using the second multitone signal.

In this case, the method may further comprise, when each one of the two transmission frequency bands comprises at least two groups of at least two channels, the performing of a third non-linear operation between the periodic signal of frequency $F_B-F_2$ and a periodic signal of frequency $F_3$ generating a third multitone signal of which the frequency spectrum comprises two main lines at frequencies $F_B-F_2-F_3$ and $F_B-F_2+F_3$, and a fourth non-linear operation between the periodic signals of frequencies $F_B+F_2$ and $F_3$ generating a fourth multitone signal of which the spectrum comprises two main lines at frequencies $F_B+F_2-F_3$ and $F_B+F_2+F_3$.

In this case, the method may further comprise the steps of:
generating periodic signals of frequencies $F_B-F_2-F_3$ and $F_B-F_2+F_3$ using the third multitone signal;
generating periodic signals of frequencies $F_B-F_2-F_3$ and $F_B+F_2+F_3$ using the fourth multitone signal.

Alternatively, the method may further comprise the steps of:
generating periodic signals of frequencies $F_A-F_1$ and $F_A+F_1$ using the first multitone signal;
carrying out of a third non-linear operation between the second multitone signal and a periodic signal of frequency $F_3$ generating a fifth multitone signal of which the spectrum comprises four main lines at the frequencies $F_B-F_2-F_3$, $F_B-F_2+F_3$, $F_B+F_2-F_3$ and $F_B+F_2+F_3$;
generating of at least one periodic signal of frequency equal to one of the frequencies $F_B-F_2-F_3$, $F_B-F_2+F_3$, $F_B+F_2-F_3$ and $F_B+F_2+F_3$ using the fifth multitone signal.

The method may further comprise:
during the receiving of a signal in one of the two transmission frequency bands, a first transposition in an intermediate frequency band of the signal received using one of the two periodic signals of frequencies $F_A-F_1$ and $F_A+F_1$, then a second transposition in baseband of the signal coming from the first transposition using one of the periodic signals of frequencies $F_B-F_2$, $F_B+F_2$, $F_B-F_2-F_3$, $F_B-F_2+F_3$, $F_B+F_2-F_3$ and $F_B+F_2+F_3$, and
during the emitting of a signal in the other of the two transmission frequency bands, a first transposition in the intermediate frequency band of a signal in baseband using one of the periodic signals of frequencies $F_B-F_2$, $F_B+F_2$, $F_B-F_2-F_3$, $F_B-F_2+F_3$, $F_B+F_2-F_3$ and $F_B+F_2+F_3$, then a second transposition in the other of the two transmission frequency bands of the signal coming from the first transposition using the other of the two periodic signals of frequencies $F_A-F_1$ and $F_A+F_1$.

The different periodic signals may advantageously correspond to sinusoidal signals of which the frequency spectrums each comprise a line, or peak, of frequency equal to the frequency of the signal.

BRIEF DESCRIPTION OF THE DRAWINGS

This invention shall be better understood when reading the description of embodiments given solely for the purposes of information and in no way limited, in reference to the annexed drawings wherein.

Identical, similar or equivalent parts of the various figures described hereinafter bear the same numerical references in order to facilitate passing from one figure to the other.

The various parts shown in the figures are not necessarily shown according to a uniform scale, in order to make the figures more readable.

The various possibilities (alternatives and embodiments) have to be understood as not being exclusive with respect to one another and can be combined together.

DETAILED DISCLOSURE OF PARTICULAR EMBODIMENTS

Figure 1:
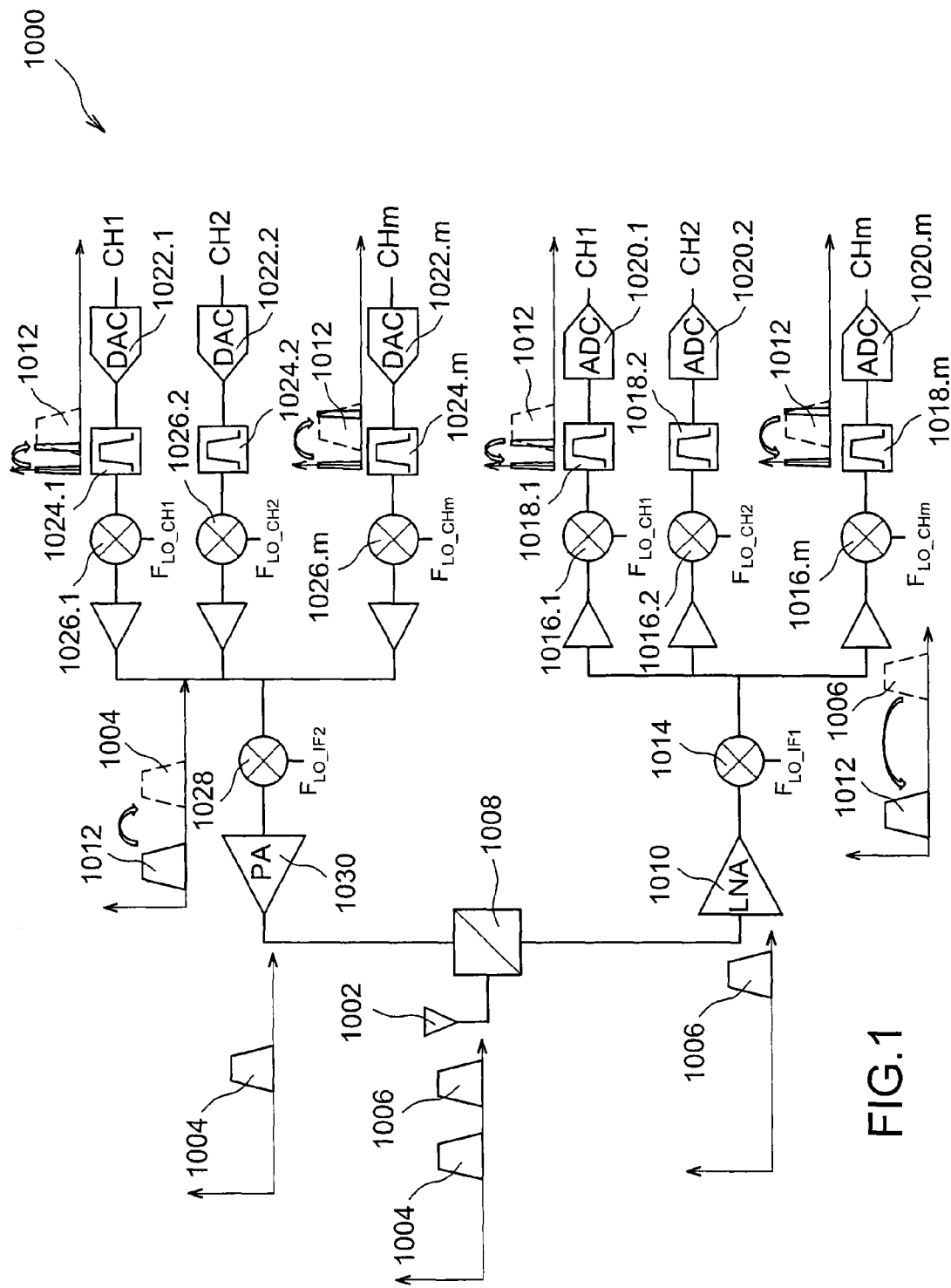
FIG. 1 diagrammatically shows a portion of a device for emitting and receiving signals according to a particular embodiment.

Reference is first made to FIG. 1 which diagrammatically shows a portion of a device 1000 for emitting and receiving able to carry out an emitting and a receiving of signals in two RF transmission frequency bands, for example of the E-band type (transmission in the bands 71-76 GHz and 81-86 GHz), and carrying out transpositions of frequencies using m channels allowing for a division of each one of these RF bands into m frequency sub-bands, m being an integer greater than 1.

The device 1000 comprises an antenna 1002 used for emitting and receiving data. In the example described here, the frequencies of the transmission frequency band used for emitting data, shown symbolically with the reference 1004, are less than those of the transmission frequency band used for receiving data, shown symbolically with the reference 1006. The low frequency band 1004 used for the emitting of data corresponds for example to the band 71-76 GHz, and the high frequency band 1006 used for the receiving of data corresponds for example to the band 81-86 GHz. Alternatively, the low frequency band 1004 could be used for receiving data and the high frequency band 1006 for emitting data. The device 1000 also comprises an element 1008 allowing the antenna 1002 to operate together with the emitting elements and the receiving elements of the device 1000.

When a signal is received by the antenna 1002, the latter is sent, via the element 1008, as input of a low noise amplifier (LNA) 1010, then transposed in an intermediate frequency band 1012 by a mixer 1014 receiving as input the signal received and a stable periodic signal of frequency $F_{LO\_IF1}$, called $S_{LO\_IF1}$.

The width of the high frequency band 1006 corresponds to that of the intermediate frequency band 1012. Several analog-to-digital converters are used to convert the signals that are in the different channels of this frequency band. This wide frequency band 1012 is demultiplexed in frequency in order to obtain m sub-bands with less wider frequencies distributed over m channels each comprising an analog-to-digital converter, making it possible to recover the signals transmitted in the different channels of the band 1006.

This demultiplexing is carried out on the m channels via a second transposition of frequencies of m portions of the intermediate frequency band 1012 to m lower intermediate frequency bands, or directly as baseband (directly as baseband in the example shown in FIG. 1). In FIG. 1, this demultiplexing, or second transposition of frequencies, is carried out via m mixers 1016.1-1016.m each receiving as input the signal in the intermediate frequency band 1012 and a stable periodic signal of central frequency adapted to the portion of the intermediate frequency band 1012 intended to be recovered and transposed into baseband. Each one of the mixers 1016.1-1016.m therefore receives as input, in addition to the intermediate frequency signal, a stable periodic signal with a different frequency for each channel, here frequencies $F_{LO\_CH1}$ to $F_{LO\_CHm}$, with these signals being called $S_{LO\_CH1}$ to $S_{LO\_CHm}$. The signals in baseband obtained at the output of the mixers 1016.1-1016.m are then filtered individually by bandpass filters 1018.1-1018.m, then digitally converted by analog-to-digital converters 1020.1-1020.m, and outputted on the channels CH1 to CHm.

In order to carry out an emitting of signals, the operations that are inversed to those carried out during the receiving described hereinabove are implemented. As such, the signals in baseband of the channels CH1 to CHm are first of all converted individually by digital-to-analog converters 1022.1-1022.m, then filtered individually by bandpass filters 1024.1-1024.m, and transposed in the intermediate frequency band 1012 via a multiplexing in the frequency domain carried out by the mixers 1026.1-1026.m each receiving as input one of the filtered analog signals and one of the signals $S_{LO\_CH1}$ to $S_{LO\_CHm}$. The signals that are in the intermediate frequency band 1012 combined as such form a single signal distributed over the intermediate frequency band 1012. A transposition in the frequency band 1004 is then carried out by a mixer 1028 receiving as input the signal in the intermediate frequency band 1012 as well as a signal of frequency $F_{LO\_IF2}$, called $S_{LO\_IF2}$. The output signal of the mixer 1028 is finally amplified by a power amplifier 1030 then emitted by the antenna 1002.

The different channels CH1 to CHm operate simultaneously or not during an emitting or a receiving of data.

In an emitting-receiving device of the FDD type, the intermediate frequency bands used for emitting and receiving are similar.

Figure 2:
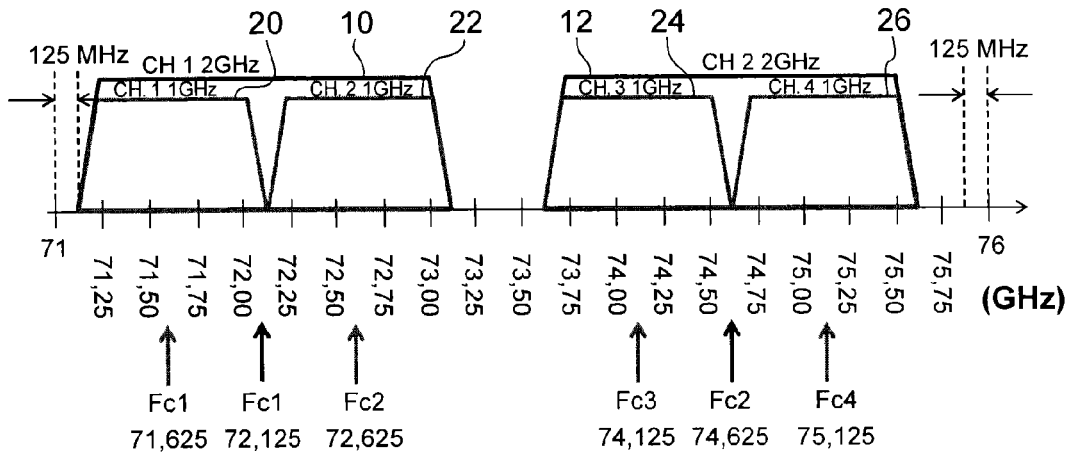
FIG. 2 shows examples of the distribution of channels in a transmission frequency band used in the device.

FIG. 2 shows two example of distribution of the channels in the low frequency transmission band 71-76 GHz.

A first example can be seen on this figure wherein two channels CH1 and CH2 referenced as 10 and 12, each one of a width equal to 2 GHz, are used in the band 71-76 GHz. By analogy with FIG. 1, this first example corresponds to a configuration of the device 1000 wherein m=2. In this case, the first channel 10 has a central frequency $F_{c1}$=72.125 GHz, and the second channel 12 has a central frequency $F_{c2}$=74.625 GHz. A second example is also shown wherein four channels CH1 to CH4 referenced as 20, 22, 24 and 26, each one with a width equal to 1 GHz, are used (case in FIG. 1 wherein m=4). In this case, the first channel 20 has a central frequency $F_{c1}$=71.625 GHz, the second channel 22 has a central frequency $F_{c2}$=72.625 GHz, the third channel 24 has a central frequency $F_{c3}$=74.125 GHz, and the fourth channel 26 has a central frequency $F_{c4}$=75.125 GHz. It can also be seen in this figure that in all of the cases, guard bands of 125 MHz are present at the ends of the low frequency transmission band. A similar configuration of the channels is found in the high frequency transmission band 81-86 GHz.

The generating of signals $S_{LO\_CH1}$ to $S_{LO\_CHm}$ and of signals $S_{LO\_IF1}$ and $S_{LO\_IF2}$ is carried out using the symmetries that exist between the central frequencies of the different channels and between the transmission frequency bands 1004 and 1006. As such, in the two examples shown in FIG. 2, it can be seen that the distribution of the channels in the band 71-76 GHz is symmetrical around the frequency 73.375 GHz, called $F_{CLA}$ (idem in the band 81-86 GHZ around the frequency 83.375 GHz, called $F_{CUA}$). In addition, the two high and low frequency transmission bands each have a central frequency (73.5 GHz for the band 71-76 GHz and 83.5 GHz for the band 81-86 GHz) separated equally by a frequency of symmetry called $F_{CA}$, which is equal to 78.5 GHz for the bands 71-76 GHz and 81-86 GHz.

Figure 3:
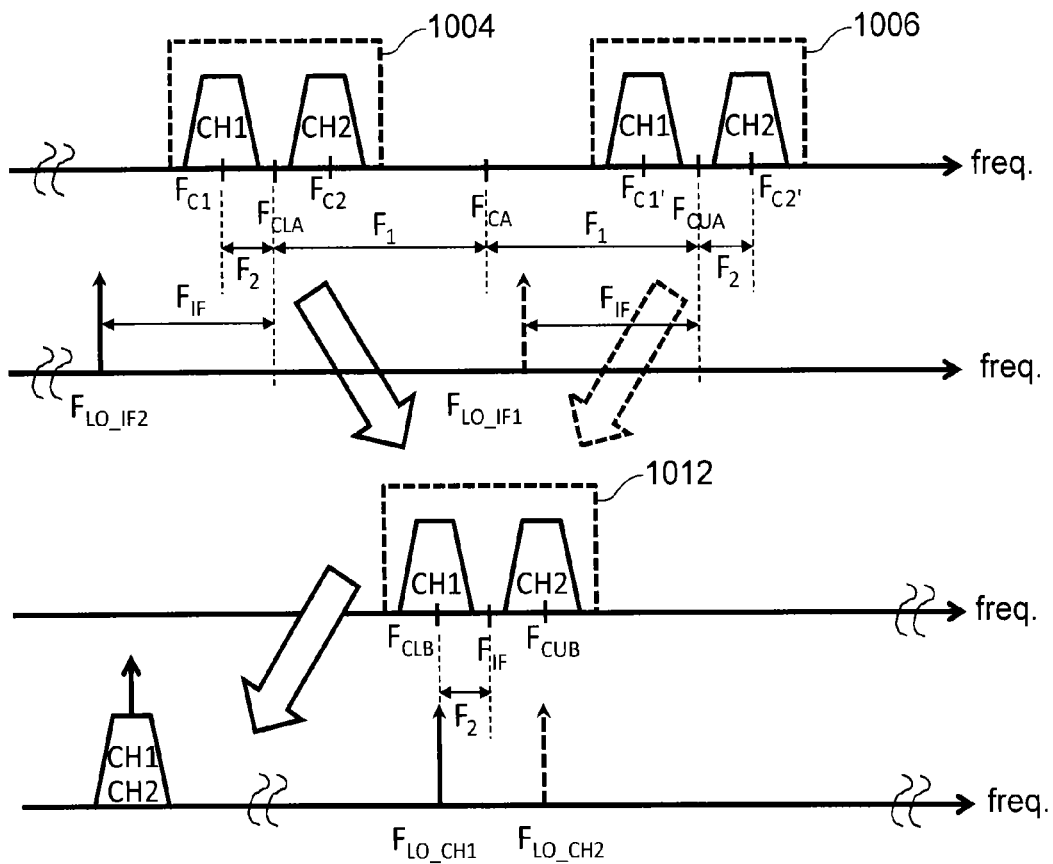
FIG. 3 shows the use of symmetries in order to generate the frequencies used in the device.

FIG. 3 shows the principle used to generate the signals $S_{LO\_CH1}$ to $S_{LO\_CHm}$ and signals $S_{LO\_IF1}$ and $S_{LO\_IF2}$ according to the distributions of the channels in the emitting-receiving high and low frequency bands.

In the example of FIG. 3, two channels CH1 and CH2 of a width equal to 2 GHz are present in the low frequency transmission band 1004 (for example the band 71-76 GHz) and are arranged symmetrically in this band on either side of the frequency $F_{CLA}$. This configuration corresponds to the channels 10 and 12 described hereinabove in liaison with FIG. 2. The distance between each one of the central frequencies $F_{c1}$ and $F_{c2}$ of the channels CH1 and CH2 and the frequency $F_{CLA}$ is called $F_2$. Likewise, two channels CH1 and CH2 of the same width are present in the high frequency transmission band 1006 (for example the band 81-86 GHz) and are arranged symmetrically in this band on either side of the frequency $F_{CUA}$. The distance between the central frequencies $F_{c1'}$ and $F_{c2'}$ of these channels and the frequency $F_{CUA}$ also corresponds to $F_2$. The two frequencies $F_{CLA}$ and $F_{CUA}$ are at an equal distance from the frequency of symmetry of the bands called $F_{CA}$, with this distance being called $F_1$.

The frequency $F_{LO\_IF2}$ corresponds to the frequency making it possible to carry out the transposition between the intermediate frequency band 1012 and the low frequency transmission band 1004. The frequency $F_{LO\_IF1}$ corresponds to the frequency that makes it possible to carry out the transposition of the high frequency transmission band 1006 in the intermediate frequency band 1012. The distance between the frequency $F_{LO\_IF2}$ and the frequency $F_{CLA}$, called $F_{IF}$, is equal to that between the frequency $F_{LO\_IF1}$ and the frequency $F_{CUA}$.

The channels that are transposed in the intermediate frequency band 1012 have symmetry around the frequency $F_{IF}$. In the example of FIG. 3, the channels CH1 coming from the high and low frequency transmission bands 1004 and 1006 both have, after transposition in the intermediate frequency band 1012, the same central frequency $F_{CLB}$ and the channels CH2 both have the same central frequency $F_{CUB}$. The distance between $F_{IF}$ and one of these two central frequencies is the same as the distance $F_2$ identified hereinabove.

The passage between the intermediate frequency band 1012 and the baseband for the channels is carried out using frequencies $F_{LO\_CH1}$ and $F_{LO\_CH2}$. These two frequencies are symmetrical in relation to the frequency $F_{IF}$.

Analogous symmetries are present by considering that each one of the channels CH1 and CH2 described in liaison with FIG. 3 corresponds to a group of at least two channels.

The device 1000 therefore comprises a frequency synthesis device making it possible to simultaneously generate the frequency-stable periodic signals $S_{LO\_IF1}$, $S_{LO\_IF2}$, and $S_{LO\_CH1}$ to $S_{LO\_CHm}$ in the example described hereinabove, and that with a minimum of elements thanks to the symmetries identified. This frequency synthesis device generates these signals by combining two frequency components, one making it possible to obtain the centre of symmetry and the other corresponding to the spacing between this centre and the desired frequencies. For this, the frequency synthesis device comprises two portions, each based on a PLL, one making it possible to generate the signals of frequencies $F_{LO\_IF1}$, $F_{LO\_IF2}$, and the other making it possible to generate the signals of frequencies $F_{LO\_CH1}$ to $F_{LO\_CHm}$.

Figure 4:
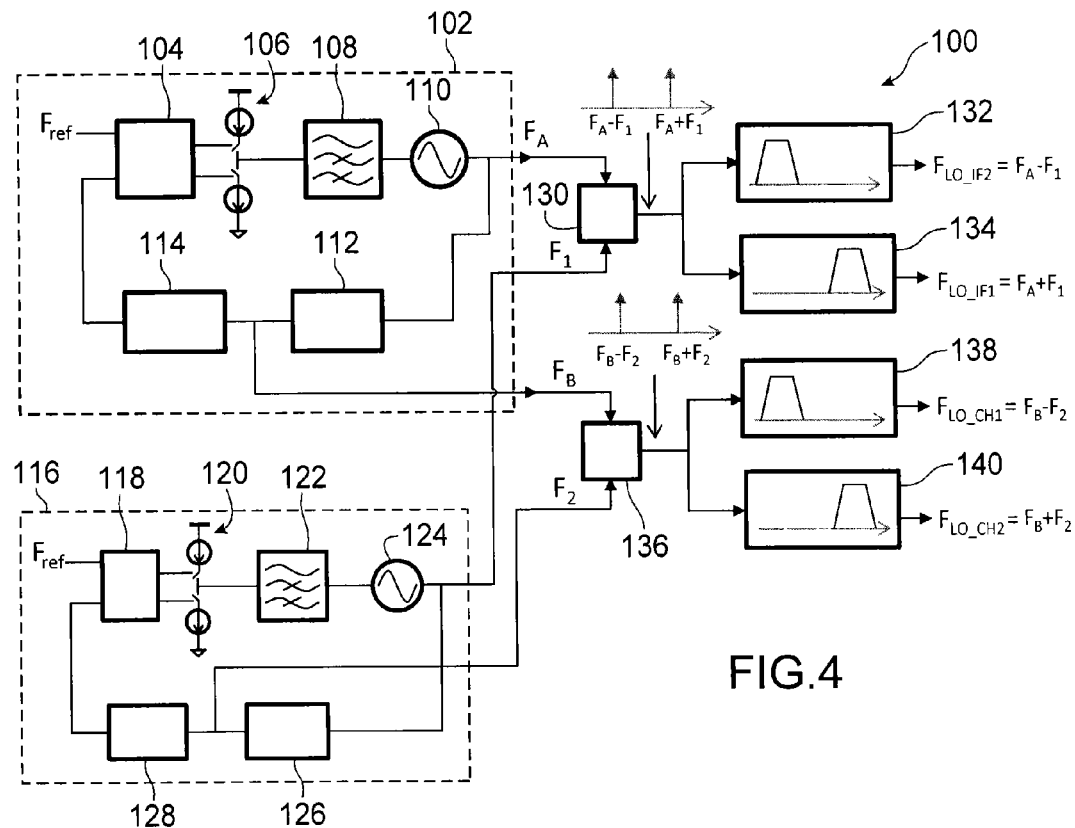
FIG. 4 shows an embodiment of a frequency synthesis device that is part of an emitting and/or receiving device.

FIG. 4 shows such a frequency synthesis device 100 according to a first embodiment.

The device 100 comprises a first PLL 102. A reference periodic signal that is very stable in frequency, for example coming from a quartz resonator, of frequency $F_{ref}$, is applied on a first input of a phase comparator 104 (PFD for "Phase Frequency Detector"). The output signals of the phase comparator 104 are sent as input of a charge pump circuit 106 then of a high-pass filter 108. The filter 108 outputs a signal applied on the input of an oscillator 110, here a VCO (voltage-controlled oscillator), for example carried out in the form of differential crossed pairs (resonator coupled with a negative resistance) outputting a sinusoidal signal of frequency $F_A$. This frequency signal $F_A$ is used for the generation of signals of frequency $F_{LO\_IF1}$ and $F_{LO\_IF2}$. This signal is applied as input of a first frequency divider 112 carrying out a frequency division of factor N1 corresponding to a number greater than 1, and advantageously an integer greater than 1.

This first frequency divider 112 outputs a signal of frequency $F_B = F_A / N1$ used for the generating of the signals of frequency $F_{LO\_CH1}$ to $F_{LO\_CHm}$ ($F_{LO\_CH1}$ and $F_{LO\_CH2}$ in the example of FIG. 4). This signal is furthermore applied as input of a second frequency divider 114 carrying out a frequency division of a factor N2 which corresponds to a number greater than 1, and advantageously an integer greater than 1, and of which the output is connected to a second input of the phase comparator 104. The factor N2 is such that $F_{ref}=F_B/N2=F_A/(N1 \cdot N2)$.

The device 100 comprises a second PLL 116. The reference signal of frequency $F_{ref}$ is applied to a first input of a second phase comparator 118. The output signals of the second phase comparator 118 are sent as input of a second charge pump circuit 120 and of a second high-pass filter 122. The second filter 122 outputs a signal applied on the input of a second oscillator 124, here a VCO, outputting a signal of frequency $F_1$. This signal of frequency $F_1$ is used for the generating of the signals of frequency $F_{LO\_IF1}$ and $F_{LO\_IF2}$. This signal is applied as input of a third frequency divider 126 carrying out a frequency division of a factor N3 which corresponds to a number greater than 1, and advantageously an integer greater than 1. This third frequency divider 126 outputs a signal of frequency $F_2=F_1/N3$ used for the generating of the signals of frequency $F_{LO\_CH1}$ and $F_{LO\_CH2}$. This signal is furthermore applied as input of a fourth frequency divider 128 carrying out a frequency division of a factor N4 which corresponds to a number greater than 1, and advantageously an integer greater than 1, and of which the output is connected to a second input of the second phase comparator 118. The factor N4 is such that $F_{ref}=F_2/N4=F_1/(N3 \cdot N4)$.

The oscillators 110 and 124 can be made as described in documents "A 60 GHz UWB impulse radio transmitter with integrated antenna in CMOS65 nm SOI technology" by A. Siligaris and al., Silicon Monolithic Integrated Circuits in RF Systems (SiRF), 2011 IEEE 11th Topical Meeting on, pp. 153-156, 17-19 Jan. 2011 and "A 17.5-to-20.94 GHz and 35-to-41.88 GHz PLL in 65 nm CMOS for wireless HD applications" by O. Richard and al., Solid-State Circuits Conference Digest of Technical Papers (ISSCC), 2010 IEEE International, pp. 252-253, 7-11 Feb. 2010.

The frequency dividers 112, 114, 126 and 128 can use different architectures according to the value of the divided frequency. At high frequencies, frequency dividers such as the dividers 112 and 114 use circuits of the CML ("Current Mode Logic") or ILFD ("Injection Locked Frequency Divider") type. The frequency dividers that operate at lower frequencies, for example close to 1 GHz, such as dividers 126 and 128 use purely numerical architectures of the counter type. If the dividers 126 and 128 operate at higher frequencies, these dividers comprise for example a first division stage of the CML type which reduces the frequency to be divided, outputting for example a frequency of about 1 GHz, then a second stage forming purely digital dividers. The circuits forming the frequency dividers can be programmed so that the values of the division factors can be adjusted, according to the values of the frequencies $F_A$, $F_B$, $F_1$ and $F_2$ sought.

The signals of frequencies $F_A$ and $F_1$ are applied as input of a first element 130 performing a non-linear operation between these signals and generating a first multitone, or multi-frequency, signal, using these signals. This first element 130 corresponds for example to a mixer carrying out a multiplication of the input signals of frequencies $F_A$ and $F_1$. The first multitone signal obtained at the output of the first element 130 therefore comprises, in its frequency spectrum, a first main line at the frequency $F_A-F_1$ which corresponds to the frequency $F_{LO\_IF2}$, and a second main line at the frequency $F_A+F_1$ which corresponds to the frequency $F_{LO\_IF1}$. This first multitone signal is sent to the input of a first frequency recovery circuit 132 rejecting the frequencies other than the frequency $F_{LO\_IF2}$ and outputting the periodic signal of frequency $F_{LO\_IF2}$, and at the input of a second frequency recovery circuit 134 rejecting the frequencies other than the frequency $F_{LO\_IF1}$ and outputting the periodic signal of frequency $F_{LO\_IF1}$.

The signals of frequencies $F_B$ and $F_2$ are applied as input of a second element 136 performing a non-linear operation between these signals and generating a second multitone signal using these signals. This second element 136 corresponds for example to a mixer carrying out a multiplication of the input signals of frequencies $F_B$ and $F_2$. The second multitone signal obtained at the output of the second element 136 therefore comprises, in its frequency spectrum, a first main line at the frequency $F_B-F_2$ which corresponds to the frequency $F_{LO\_CH1}$, and a second main line at the frequency $F_B+F_2$ which corresponds to the frequency $F_{LO\_CH2}$. This second multitone signal is sent as input of a third frequency recovery circuit 138 rejecting the frequencies other than the frequency $F_{LO\_CH1}$ and outputting the signal of frequency $F_{LO\_CH1}$, and as input of a fourth frequency recovery circuit 140 rejecting the frequencies other than the frequency $F_{LO\_CH2}$ and outputting the signal of frequency $F_{LO\_CH2}$.

The frequency recovery circuits 132, 134, 138 and 140 correspond for example to selective bandpass filters such as multi-component filters or filters comprising elements of the MEMS or BAW (bulk acoustic waves) type, and/or ILOs able to be locked at the desired frequency and to output the periodic signals of the desired frequencies. An ILO acts both as a highly selective bandpass filter and as a signal regenerator, through the locking carried out on the desired frequency.

The frequency recovery circuits 132, 134, 138 and 140 each play a role of bandpass filter with very high selectivity, and can each correspond to an ILO or several ILO circuits arranged in cascade. The carrying out of such an ILO is for example described in the document "A 50 GHz direct injection locked oscillator topology as low power frequency divider in 0.13 μm CMOS" by M. Tiebout, Solid-State Circuits Conference, 2003. ESSCIRC '03. Proceedings of the 29th European, pp. 73-76, 16-18 Sep. 2003.

As such, it is obtained at the output of the device 100 signals $S_{LO\_IF1}$, $S_{LO\_IF2}$, and $S_{LO\_CH1}$ to $S_{LO\_CHm}$ of pure spectrum, i.e. comprising a single line at the desired frequency, of which the phase is locked on that of the reference signal of frequency $F_{ref}$, with all of the other undesired components having been rejected outside of the frequency spectrums of these signals by the frequency recovery circuits 132, 134, 138 and 140. However, the rejecting of lines adjacent to the main line is not infinite in practice. As such, the signals $S_{LO\_IF1}$, $S_{LO\_IF2}$, and $S_{LO\_CH1}$ to $S_{LO\_CHm}$ obtained as output of the frequency recovery circuits 132, 134, 138 and 140 can correspond not to pure sinusoidal signals, but to periodic signals of which the frequency spectrums each have a main line at the desired frequency as well as secondary lines located at frequencies that are multiples of that of the main line. It is possible to increase this rejection by connecting in cascade (i.e. in series) several ILO and/or bandpass filters in order to form each one of the frequency recovery circuits 132, 134, 138 and 140, and as such attenuate even further the secondary lines of the frequency spectrums of the signals obtained at the output of these circuits.

Figure 5:
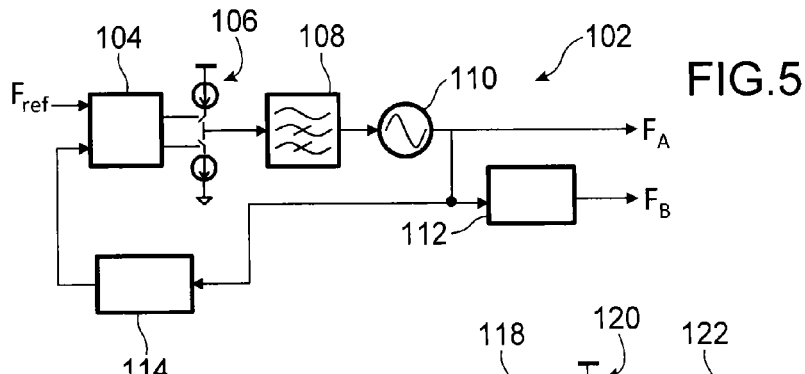
FIGS. 5 and 6 show alternative embodiments of PLL of a frequency synthesis device that is part of an emitting and/or receiving device.

FIG. 5 shows an alternative embodiment of the first PLL 102. In this alternative embodiment, the input of the second frequency divider 114 is not connected to the output of the first frequency divider 112, but is connected to the output of the oscillator 110. In this configuration, the frequencies $F_A$ and $F_B$ are such that $F_B=F_A/N1$ and $F_{ref}=F_A/N2=F_B \cdot N1/N2$.

Figure 6:
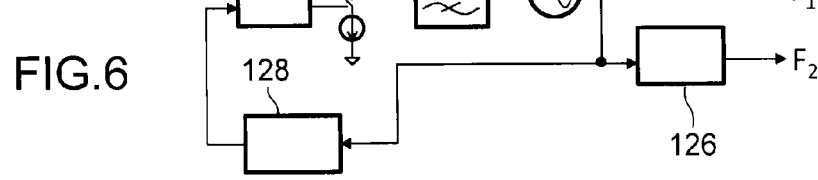

FIG. 6 shows an alternative embodiment of the second PLL 116. In this alternative embodiment, the input of the fourth frequency divider 128 is not connected to the output of the third frequency divider 126, but is connected to the output of the oscillator 124. In this configuration, the frequencies $F_1$ and $F_2$ are such that $F_2=F_1/N3$ and $F_{ref}=F_1/N4=F_2 \cdot N3/N4$.

The components of the PLL 102 and 116 are chosen and dimensioned such that the frequencies $F_A$, $F_B$, $F_1$ and $F_2$ of the signals generated are adapted to the channels of the high and low frequency transmission bands used. Indeed, by considering the low frequency transmission band, the frequencies $F_A$ and $F_B$ are such that $F_{CLA}=F_A-F_1+F_{IF}$ and $F_{IF}=F_B=F_A/N1$. The frequency $F_A$ is therefore such that $F_A=N1 \cdot (F_{CLA}+F_1)/(N1+1)$. With regards to the high frequency transmission band, the frequencies $F_A$ and $F_B$ can also be characterised such that $F_{CUA}=F_A+F_1+F_{IF}$, with always $F_{IF}=F_B=F_A/N1$. The frequency $F_A$ is therefore also such that $F_A=N1 \cdot (F_{CUA}-F_1)/(N1+1)$. The values of $F_{CLA}$, $F_{CUA}$, $F_1$ and $F_2$ correspond to specifications stemming from the configuration of the channels (number, width) used in the emission and reception frequency bands. For example, in the case of a transmission of the E-band type with channels of a width equal to 1 GHz or 2 GHz (corresponding to the examples described in liaison with FIG. 2), these frequencies are $F_{CLA}=73.375$ GHz, $F_{CUA}=83.375$ GHz, $F_1=5$ GHz, and $F_2=1.25$ GHz.

Alternatively, it is possible that the device 100 comprises, instead of the two PLL 102 and 116, a single PLL for generating the signals of frequencies $F_A$, $F_B$, $F_1$ and $F_2$. Such a configuration is possible when the values of $F_A$, $F_B$, $F_1$ and $F_2$ have a common divisor other than 1.

The principles hereinabove apply when two channels are distributed in each one of the transmission frequency bands, but also when more than two channels are distributed in each one of these bands when their central frequencies are distributed symmetrically inside each transmission frequency band. In this case, the second multitone signal obtained at the output of the second element 136 is used to generate more than two periodic signals of different frequencies.

Figure 7:
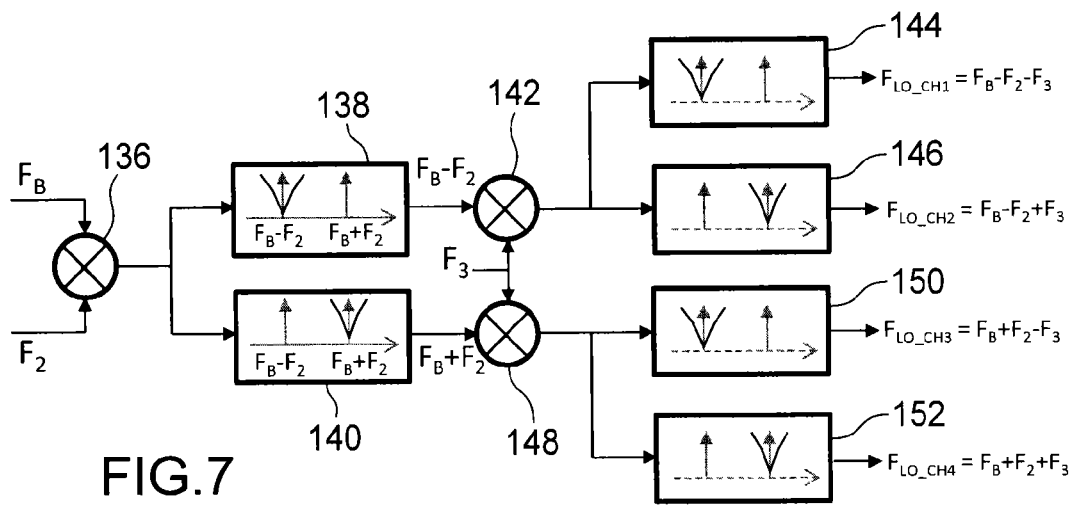
FIG. 7 shows a portion of a frequency synthesis device that is part of an emitting and/or receiving device allowing for a transmission of data over four channels in each one of the transmission frequency bands.

FIG. 7 shows a portion of the device 100 wherein the second multitone signal obtained using periodic signals of frequencies $F_B$ and $F_2$ allows for the generating of more than two periodic signals of different frequencies (four in the example of FIG. 7).

As in the example described hereinabove, the signals of frequencies $F_B$ and $F_2$ are applied as input of the second element 136 (here a mixer). The second multitone signal obtained at the output of the second element 136 is applied as input of the two frequency recovery circuits 138 and 140 (here ILOs) outputting the signals of frequencies $F_B-F_2$ and $F_B+F_2$. The signal outputted by the third frequency recovery circuit 138 is applied as input of a third element 142 (here a mixer) performing a non-linear operation between the frequency signal $F_B-F_2$ and a periodic signal (for example sinusoidal) of frequency $F_3$ and generating a third multitone signal of which the frequency spectrum comprises two main lines at frequencies $F_B-F_2-F_3$ and $F_B-F_2+F_3$. This third multitone signal is then applied as input of a fifth frequency recovery circuit 144 (here an ILO) rejecting from the frequency spectrum the frequencies other than the frequency $F_B-F_2-F_3$ and outputting a periodic signal of frequency $F_{LO\_CH1}=F_B-F_2-F_3$, as well as input of a sixth frequency recovery circuit 146 rejecting from the frequency spectrum the frequencies other than the frequency $F_B-F_2+F_3$ and outputting a periodic signal of frequency $F_{LO\_CH2}=F_B-F_2+F_3$. In parallel to this, the signal outputted by the fourth frequency recovery circuit 140 is applied as input of a fourth element 148 (here a mixer) performing a non-linear operation between the frequency signal $F_B+F_2$ and the signal of frequency $F_3$ and generating a fourth multitone signal of which the frequency spectrum comprises two main lines at frequencies $F_B+F_2-F_3$ and $F_B+F_2+F_3$. This fourth multitone signal is then applied as input of a seventh frequency recovery circuit 150 (here an ILO) rejecting from the frequency spectrum the frequencies other than the frequency $F_B+F_2-F_3$ and outputting the signal of frequency $F_{LO\_CH3}=F_B+F_2-F_3$, as well as input on an eighth frequency recovery circuit 152 rejecting from the frequency spectrum the frequencies other than the frequency $F_B+F_2+F_3$ and outputting the signal of frequency $F_{LO\_CH4}=F_B+F_2+F_3$.

The value of $F_3$ is chosen according to the values of the frequencies $F_{LO\_CH1}$ to $F_{LO\_CHm}$ desired.

Figure 8A:
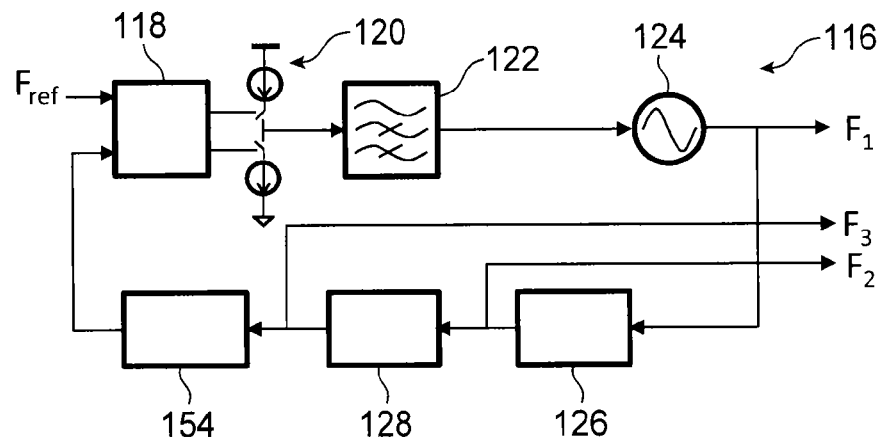
FIGS. 8A and 8B show alternative embodiments of PLL of a frequency synthesis device that is part of an emitting and/or receiving device.
Figure 8B:
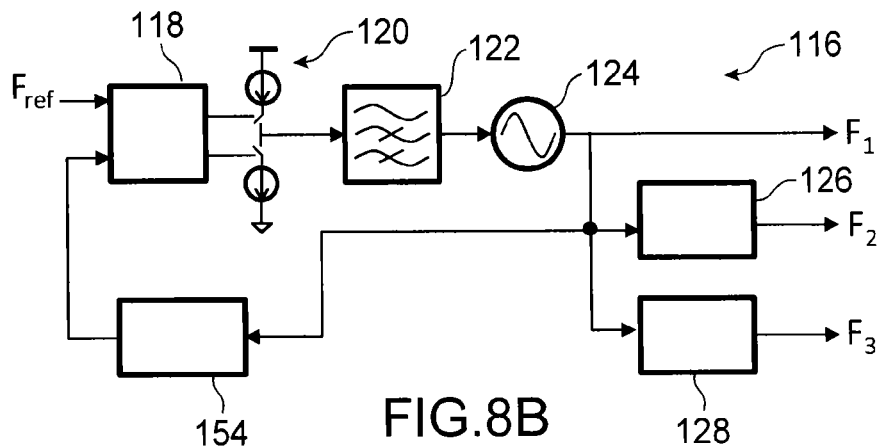

If the frequency $F_3$ has a common divisor with the frequencies $F_1$ and $F_2$, the periodic signal of frequency $F_3$ can be generated using the second PLL 116 which comprises in this case an additional frequency divider 154 performing a frequency division by a factor N5, as is the case with the embodiments of the second PLL 116 shown in FIGS. 8A and 8B. In the configuration shown in FIG. 8A, the frequencies $F_1$, $F_2$ and $F_3$ are such that: $F_2=F_1/N3$, $F_3=F_2/N4$ and $F_{ref}=F_3/N5=F_2/(N4 \cdot N5)=F_1/(N3 \cdot N4 \cdot N5)$. In the configuration shown in FIG. 8B, the frequencies $F_1$, $F_2$ and $F_3$ are such that: $F_2=F_1/N3$, $F_3=F_1/N4$ and $F_{ref}=F_1/N5=F_2 \cdot N3/N5=F_3 \cdot N4/N5$.

Figure 9:
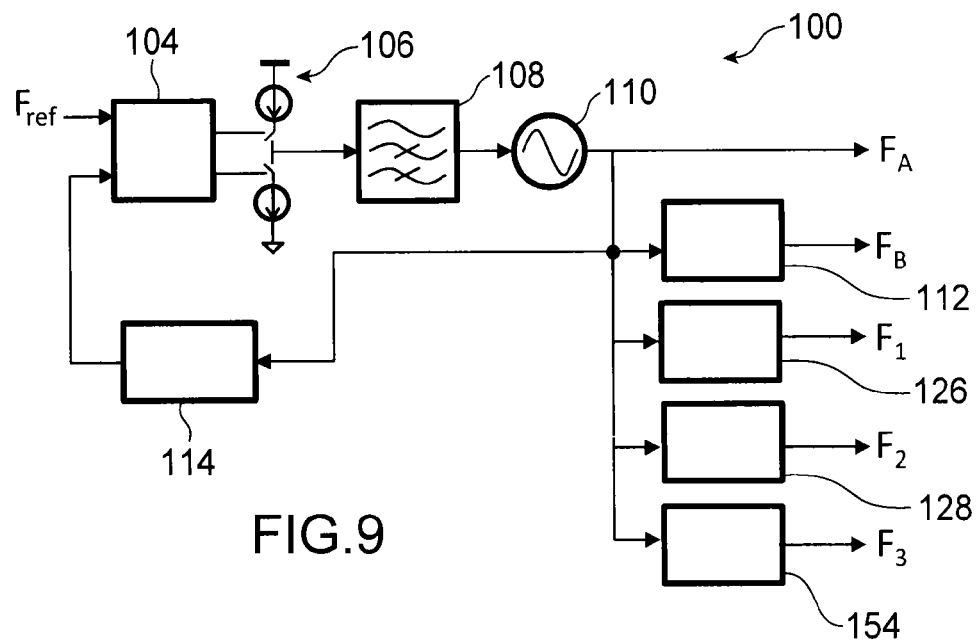
FIG. 9 shows an alternative embodiment of a PLL of a frequency synthesis device that is part of an emitting and/or receiving device.

It is also possible in this case that the device 100 comprises a single PLL in order to generate the signals of frequency $F_A$, $F_B$, $F_1$, $F_2$ and $F_3$. Such a configuration is possible when the values of $F_A$, $F_B$, $F_1$, $F_2$ and $F_3$ all have a common divisor. Such a configuration is shown in FIG. 9. In this configuration, the values of these frequencies are such that $F_B=F_A/N1$, $F_1=F_A/N2$, $F_2=F_A/N3$, $F_3=F_A/N4$, and $F_{ref}=F_A/N5$. Other configurations of the frequency dividers 112, 114, 126, 128 and 154 are possible while still having only a single PLL to generate these periodic signals.

If more than four periodic signals of different frequencies are intended to be generated for the frequency transposition between the intermediate frequency band and the baseband (more than four channels in each transmission frequency band), the signals obtained as output of at least one portion of the frequency recovery circuits 144, 146, 150 and 152 can be again sent as input of one or several elements performing non-linear operations in order to generate new multitone signals from which a greater number of periodic signals of different frequencies can be obtained at the output of other frequency recovery elements, on the basis of the same principle as that described hereinabove in liaison with FIG. 7.

Generally, in the case of a device of the E-band type, the various components can be dimensioned in different ways, in particular according to the chosen value of N1. However, all of the possible values of N1 are not judicious because the fact must be taken into account that the frequency $F_{IF}$ has to be more preferably greater than the width of the transmission frequency bands (5 GHz in the case of the E-Band) by a factor between about 3 and 10 in order to facilitate the carrying out of the device 100. This means that the large values of N1 can in this case be discarded. Furthermore, a value of N1 that is excessively low generates frequencies $F_A$ and $F_B$ that are close, which is less interesting. The tableau hereinbelow provides the values of the frequencies $F_A$ and $F_B$, as well as the ratio between the frequency $F_B$ and the width of the intermediate frequency band (5 GHz in the example described here), for different values of N1, and for $F_A = N1 \cdot (F_{CLA} + F_1)/(N1+1)$ with $F_{CLA} = 73.375$ GHz and $F_1 = 5$ GHz.

| N1 | $F_A$ (GHz) | $F_B$ (GHz) | $F_B$/BW (IF) |
|---|---|---|---|
| 1 | 39.185 | 39.185 | 7.84 |
| 2 | 52.250 | 26.125 | 5.22 |
| 3 | 58.781 | 19.593 | 3.91 |
| 4 | 62.700 | 15.675 | 3.13 |
| 5 | 65.312 | 13.062 | 2.61 |
| 6 | 67.178 | 11.190 | 2.24 |
| 7 | 68.578 | 9.796 | 1.959 |

The value of N1 can be advantageously chosen such that it is equal to 2, 3 or 4. For example, for N1=4, the values of the central frequencies of four channels CH1 to CH4 of a width equal to 1 GHz in each transmission frequency band and in the intermediate frequency band are given in the table hereinbelow. As baseband, the central frequencies of the channels are equal to 0 in emission and in reception.

|  | CH1 | CH2 | CH3 | CH4 |
|---|---|---|---|---|
| Central frequency in the intermediate frequency band (GHz) | 13.925 | 14.925 | 16.425 | 17.425 |
| Central frequency in the low frequency transmission band (GHz) | 71.625 | 72.625 | 74.125 | 75.125 |
| Central frequency in the high frequency transmission band (GHz) | 81.625 | 82.625 | 84.125 | 85.125 |

Also in the case where N1=4, the values of the central frequencies of two channels CH1 and CH2 of a width equal to 2 GHz are provided hereinbelow in the intermediate frequency band and in the transmission frequency bands. As baseband, the central frequencies of the channels are equal to 0 in emission and in reception.

|  | CH1 | CH2 |
|---|---|---|
| Central frequency in the intermediate frequency band (GHz) | 14.425 | 16.925 |
| Central frequency in the low frequency transmission band (GHz) | 72.125 | 74.625 |
| Central frequency in the high frequency transmission band (GHz) | 82.125 | 84.625 |

Hereinbelow is described an embodiment of the device 100 such as shown in FIG. 4 carrying out a transmission in the bands 71-76 GHz and 81-86 GHz with channels of a width equal to 2 GHz (two channels in each transmission band).

The resonator generates a sinusoidal signal of frequency $F_{ref} = 25$ MHz. The oscillator 110 is a VCO generating a sinusoidal signal of frequency $F_A = 62.7$ GHz. The first frequency divider 112 carries out a division of by a factor N1=4 of the frequency $F_A$, outputting as such a sinusoidal signal of frequency $F_B = 15.675$ GHz. The second frequency divider 114 carries out a frequency division of a factor N2=627, outputting as such a sinusoidal signal of frequency equal to 25 MHz.

The second PLL 116 uses the same signal of frequency $F_{ref} = 25$ MHz as the one used in the first PLL 102. The second oscillator 124 is a VCO generating a sinusoidal signal of frequency $F_1 = 5$ GHz. The third frequency divider 126 carries out a division of by a factor N3=4 of the frequency $F_1$, outputting as such a sinusoidal signal of frequency $F_2 = 1.25$ GHz. The fourth frequency divider 128 carries out a frequency division of a factor N4=50, outputting as such a sinusoidal signal of frequency equal to 25 MHz.

The elements 130 and 136 are mixers. The output signals of these mixers are sent as input of the frequency recovery circuits 132, 134, 138 and 140 corresponding to ILOs. The first frequency recovery circuit 132 outputs a substantially sinusoidal signal of frequency $F_{LO\_IF2} = 57.7$ GHz. The second frequency recovery circuit 134 outputs a substantially sinusoidal signal of frequency $F_{LO\_IF1} = 67.7$ GHz. The third frequency recovery circuit 138 outputs a substantially sinusoidal signal of frequency $F_{LO\_CH1} = 14.425$ GHz. The fourth frequency recovery circuit 140 outputs a substantially sinusoidal signal of frequency $F_{LO\_CH2} = 16.925$ GHz.

For the realisation of a device 100 carrying out a transmission in the bands 71-76 GHz and 81-86 GHz with channels of a width equal to 1 GHz (four channels in each transmission frequency band), all of the elements described hereinabove are used and coupled to those described hereinabove in liaison with FIG. 7. The third element 142 is a mixer receiving as input the signal of frequency equal to 14.425 GHz as well as a sinusoidal signal of frequency $F_3 = 500$ MHz, and the fourth element 148 is also a mixer receiving as input the signal of frequency equal to 16.925 GHz as well as the signal of frequency $F_3$. The output signals of these mixers are sent as input of the other frequency recovery circuits 144, 146, 150 and 152 corresponding to ILOs. The fifth frequency recovery circuit 144 outputs a substantially sinusoidal signal of frequency $F_{LO\_CH1} = 13.925$ GHz. The sixth frequency recovery circuit 146 outputs a substantially sinusoidal signal of frequency $F_{LO\_CH2} = 14.925$ GHz. The seventh frequency recovery circuit 150 outputs a substantially sinusoidal signal of frequency $F_{LO\_CH3} = 16.425$ GHz. The eighth frequency recovery circuit 152 outputs a substantially sinusoidal signal of frequency $F_{LO\_CH4} = 17.425$ GHz.

In the various examples and embodiments described hereinabove, the frequency recovering elements 132 and 134 generating the signals of frequency $F_{LO\_IF2}$ and $F_{LO\_IF1}$ can correspond to switchable ILOs that can be locked on one or the other of the two frequencies of the multitone signal applied as input of these elements, according to a control signal applied as input of these switchable ILOs. As such, it is possible to easily and quickly inverse the frequency bands used for the emitting and the receiving of data in the device 1000, which is very advantageous in the case of a transmission device of the E-band and other FDD types.

It is also possible that the selection elements generating the signals $S_{LO\_CHi}$ correspond to switchable ILOs, i.e. comprise a mechanism that allows them to modify their locking range, and therefore to be locked onto one of the frequencies of the spectrum of the multitone signal according to the configuration wherein each switchable ILO is found. The signal obtained at the output of a switchable ILO is therefore a frequency stable periodic signal, for example sinusoidal or substantially sinusoidal, of which the frequency spectrum comprises a single main line at the desired frequency according to the configuration wherein the switchable ILO is placed. This makes it possible, from a frequency standpoint, to switch the position of the channels if this is necessary. When each transmission frequency band comprises more than two channels, for example four channels, the use of switchable ILOs makes it possible to reduce the number of components used to generate the signals $S_{LO\_CHi}$, as shown for example in FIG. 10. Contrary to the embodiment described hereinabove in liaison with FIG. 7 wherein the output signal of the second element 136 is applied as input of the third and fourth frequency recovering elements 138 and 140, the output signal of the second element 136 applied on the input of another element 156, for example a mixer, performing a non-linear operation between the multitone signal comprising the frequencies $F_B-F_2$ and $F_B+F_2$ and the signal of frequency $F_3$. As such, the multitone signal obtained as output of the element 156 comprises in its spectrum four main lines at the frequencies $F_{LO\_CHi}$, i.e. the frequencies $F_B-F_2-F_3$, $F_B-F_2+F_3$, $F_B+F_2-F_3$ and $F_B+F_2+F_3$. This multitone signal is then applied to the input of the four switchable ILOs 158, 160, 162 and 164 each one able to lock onto one of these frequencies and outputs a substantially sinusoidal signal of frequency equal to one of these four frequencies. All of the frequency positions of the channels can be permuted in relation to one another according to the value of the control signals applied on the control inputs of these switchable ILOs. It is also possible for the same frequency to be selected by several of the switchable ILOs, for example in the case of a transmitter or of a receiver working on a single channel at the same time which can be selected between the channels allocated in the band covered by the frequency generator.

In the various embodiments described hereinabove, the multitone signals comprise main lines (corresponding to the frequencies intended to be recovered by the frequency recovery circuits) of similar amplitudes and/or in phase with one another, which allows the periodic signals generated to have substantially constant amplitudes and/or phases regardless of the frequency whereon each ILO is locked. The fact that the lines corresponding to the frequencies intended to be recovered are main lines of the frequency spectrum of the multitone signals (lines of a greater amplitude in relation to neighbouring lines) facilitates the locking of the ILOs on these lines and prevents a locking on a possible other line of the frequency spectrum of these signals. The characteristic according to which the main lines have substantially similar amplitudes can correspond to a difference in tension of about 4 dB maximum between these amplitudes.

Figure 11:
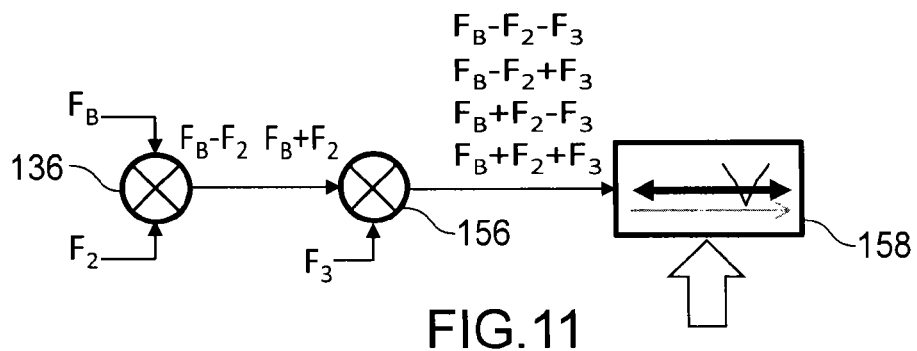
FIG. 11 shows a portion of a frequency synthesis device that is part of an emitting and/or receiving device allowing for a transmission of data over a variable frequency channel in each one of the transmission frequency bands.

The use of switchable ILOs can also be considered for carrying out variable frequency channels, as shown in FIG. 11. In this figure, a single switchable ILO 158 is used as the device 1000 is intended to operate with a single channel of which the central frequency can change. As such, the frequency of the output signal outputted by this switchable ILO 158 can correspond to one of the four frequencies that the multitone signal outputted by the element 156 comprises.

Figure 12:
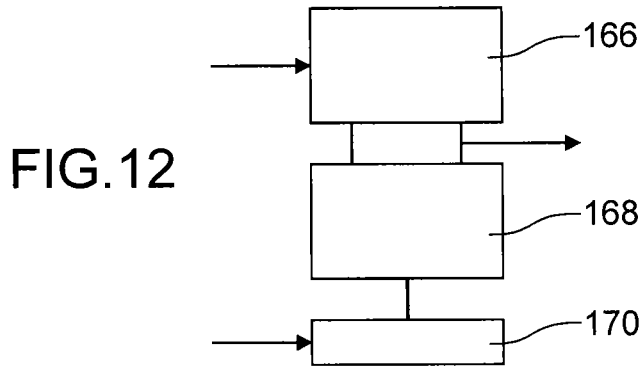
FIG. 12 diagrammatically shows the parts of a switchable injection locked oscillator used in an emitting and/or receiving device.

Reference is now made to FIG. 12 which diagrammatically shows a switchable ILO forming for example one of the frequency recovering circuits 132 and 134. The switchable ILO comprises a resonant structure 166, an electrical element 168 of which the electrical impedance is equivalent to that of a negative electrical resistance (i.e. at the terminals of which a voltage increases when the current which passes through it decreases, and inversely at the terminals of which a voltage decreases when the current that passes through it increases), and an injection circuit 170 intended to receive as input the multitone signal comprising the frequencies whereon the switchable ILO is intended to be locked.

The resonant structure 166 can be configured according to several states, each one being such that the value of the free oscillating frequency of the switchable ILO is equal to or close to that of the frequency whereon the ILO is intended to be locked. The passage, or the switching, from one state to the other of the resonant structure 166 is carried out by the intermediary of a control signal applied at the input of the resonant structure 166.

When no signal is applied at the input of the injection circuit 170, the switchable ILO oscillates at the free oscillating frequency of which the value depends on the state wherein the resonant structure 166 is located. When a signal of sufficient amplitude and of a frequency close to the free oscillating frequency of the switchable ILO is applied to the input of the injection circuit 170, the switchable ILO is then locked on this signal and the frequency of the signal outputted by the switchable ILO does not correspond to its free oscillating frequency but is equal to the frequency of the signal applied to the input of the injection circuit 170.

The locking range of the switchable ILO has a form that approaches a "V" of which the tip, or end, is at the free oscillating frequency of the switchable ILO. The value of the frequency on which this locking range is located depends on the state wherein the switchable ILO is placed. The amplitude required to lock the switchable ILO is reduced as the frequency of the signal applied as input of the injection circuit 170 is close to the free oscillating frequency of the switchable ILO.

Figure 13:
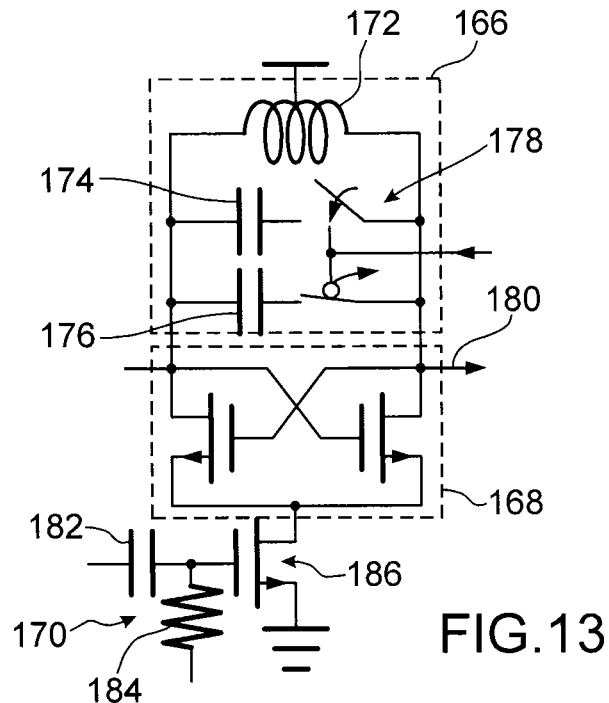
FIG. 13 diagrammatically shows an embodiment of a switchable injection locked oscillator used in an emitting and/or receiving device.

FIG. 13 diagrammatically shows an embodiment of the switchable ILO. In this example, the switchable ILO can be configured in two states, and the frequency of the signal outputted by this ILO can correspond to one of the two frequencies present in the multitone signal applied as input of the ILO. The resonant structure 166 comprises an inductance 172 coupled in parallel to a first capacitor 174 and to a second capacitor 176. The value of the electrical capacity of the first capacitor 174 is different from that of the second capacitor 176. The resonant structure 166 also comprises two switches 178 that operate in a complementary manner in relation to one another (one of the two switches being in closed position when the other of the two switches is in open position). The switches 178 are controlled by the control signal applied as input of the resonant structure 166. As such, the resonant structure 166 forms a resonant circuit LC which comprises, in the first state, the inductance 172 and the first capacitor 174, and in the second state, the inductance 172 and the second capacitor 176. The resonant circuit LC formed by the resonant structure 166 therefore comprises the first capacitor 174 or the second capacitor 176 according to the value of the control signal applied at the input of the resonant structure 166, and the free oscillating frequency of the switchable ILO is therefore modified according to the elements that form this resonant circuit LC.

Alternatively, the resonant structure 166 can comprise a single capacitor coupled to a first inductance in the first state and to a second inductance in the second state, with the values of these two inductances being different.

In another alternative, it is also possible that the resonant structure 166 comprises a first and a second inductances of different values, and a first and a second capacitors that have capacities of different values, with the first inductance being coupled electrically to the first capacitor in the first state, and the second inductance being coupled electrically to the second capacitor in the second state.

Figure 10:
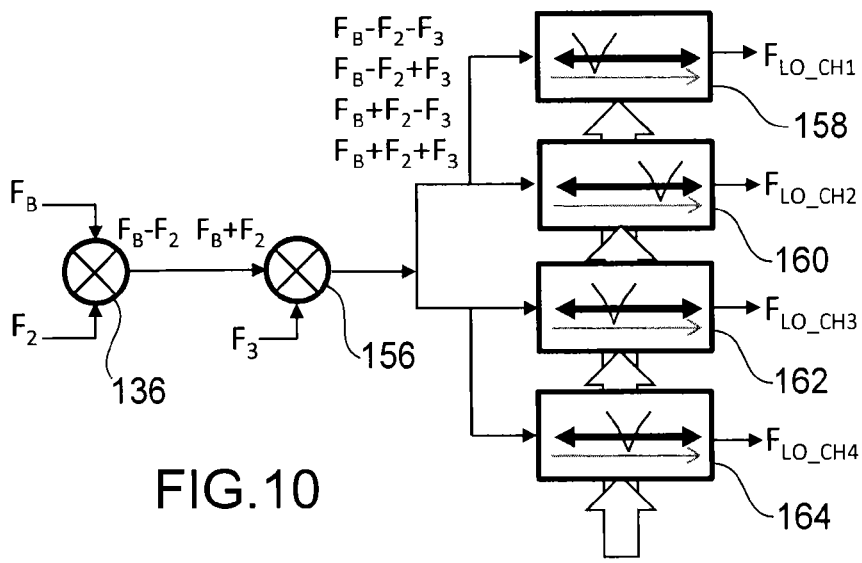
FIG. 10 shows a portion of a frequency synthesis device that is part of an emitting and/or receiving device allowing for a transmission of data over four variable frequency channels in each one of the transmission frequency bands.

In the embodiments described hereinabove in liaison with FIGS. 10 and 11, each one of the switchable ILOs 158, 160, 162 and 164 can be configured according to four different states. For this, the resonant structure of each one of these ILOs can comprise the inductance 172 as well as four capacitors that can each be coupled with the inductance 172 according to the state wherein the switchable ILO is configured, or comprise four inductances of different values that can be coupled to a capacitor, and even four inductances and four capacitors.

The electrical element 168 corresponds to a differential crossed pair of the MOS type, here formed by two NMOS transistors whereon there is an output 180 of the switchable ILO.

The injection circuit 170 comprises a capacitor 182 for blocking direct current coupled to a resistor 184. The first periodic signal is intended to be applied on a first terminal of the capacitor 182. A polarisation voltage, defining the polarisation current of the element 168, is applied on a first terminal of the resistor 184, and a second terminal of the resistor 184 is connected to a second terminal of the capacitor 182 and to the gate of a third transistor NMOS 186. The drain of the third transistor NMOS 186 is connected to the electrical element 168.

Alternatively, the third transistor NMOS 186 can comprise its source and its drain connected in parallel to the resonant structure 166.

According to another alternative, the injection circuit 170 can comprise, in place of the third transistor NMOS 186, two MOS transistors of which the drains are connected to the drains of two MOS transistors of the electrical element 168 and of which the sources are connected to a source of polarisation current. In this alternative, the injection circuit 170 also comprises the capacitor 182 coupled to the resistor 184 in a manner analogous to the configuration described hereinabove in liaison with FIG. 13. The multitone signal is intended to be applied on the first terminal of the capacitor 182 and a polarisation voltage is intended to be applied on the first terminal of the resistor 184, the second terminal of the resistor 184 being connected to the second terminal of the capacitor 182 and to the gates of the two MOS transistors of the injection circuit 170 (the multitone signal being in this case a differential signal).

The values of the inductance or of the inductances and of the electrical capacity or capacities of the capacitors of the resonant structure 166 are chosen such that the free oscillating frequency of the switchable ILO in the state chosen is close to or equal to the frequency whereon the ILO is intended to be locked. As such, the switchable ILO that receives as input a multitone signal comprising at least two main lines at different frequencies outputs a frequency stable periodic signal and with a frequency equal to one of the frequencies of the main lines of the multitone signal according to the state wherein the resonant structure of the switchable ILO is located. The frequency of the output signal of the switchable ILO can be easily and quickly switched between these different frequencies by changing the state that the resonant structure is in. The switchable ILO acts as a highly selective bandpass filter through the locking carried out on the desired frequency.

In another alternative embodiment, it is possible that the frequency recovery circuits generating the signals $S_{LO\_CHi}$ be such that, at the output of each one of these circuits, two signals $S_{LO\_CHi\_I}$ and $S_{LO\_CHi\_Q}$ of the same frequency and of the same amplitude, but which between them have a phase shift of 90°, i.e. one in phase with the signal applied as input of the frequency recovery circuit and the other in phase quadrature in relation to this signal (I/Q signals). Such an alternative can in particular be used within a multichannel architecture that performs a direct conversion of an intermediate frequency band to the baseband.

Figure 14:
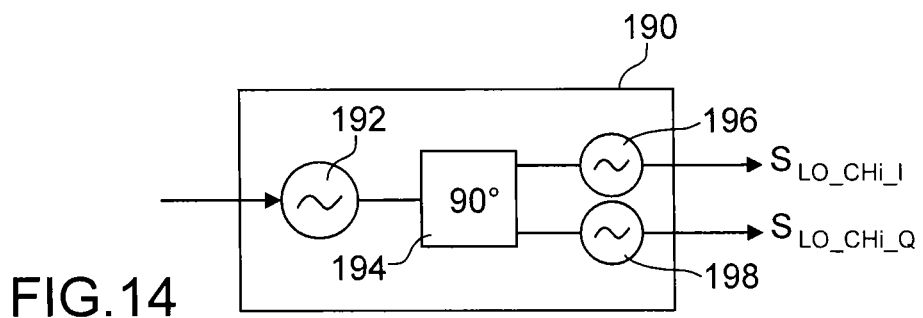
FIG. 14 diagrammatically shows an embodiment of a frequency recovery circuit making it possible to output I/Q signals of the same frequency and used in an emitting and/or receiving device.

FIG. 14 shows an embodiment of a frequency recovery circuit 190 that makes it possible to output such signals. The circuit 190 receives as input the multitone signal comprising in its spectrum the corresponding frequency $F_{LO\_CHi}$ for example one of the two frequencies $F_B-F_2$ and $F_B+F_2$. The circuit 190 comprises a first ILO 192 of which the input receives the multitone signal and of which the output is connected to the input of a phase-shifting element 194 of the active or passive type that makes it possible to reproduce on one of its two outputs the signal applied as input and to generate on the other of its two outputs the signal applied as input and phase-shifted of 90°. Each one of these two signals are applied as inputs of two other ILOs 196 and 198 that output the signals $S_{LO\_CHi\_I}$ and $S_{LO\_CHi\_Q}$. The two ILOs 196 and 198 operate either independently from one another, or in a coupled manner such that the outputs of the two ILOs 196 and 198 are phase shifted from each other by 90° without using the phase-shifting element 194. The operation of such an element of the Quadrature VCO (QVCO) type is for example described in the document "A 17.5-to-20.94 GHz and 35-to-41.88 GHz PLL in 65 nm CMOS for wireless HD applications" by O. Richard and al., Solid-States Circuits Conference Digest of Technical Papers (ISSCC), 2010 IEEE International, pages 252-253, 7-11 Feb. 2010.

The device 1000 described hereinabove can correspond to a radiofrequency transmission device. The device 1000 can also be an emitting-receiving device of the electro-optical type able to send data via a multiplexing in wavelengths (WDM), i.e. by modulating several wavelengths sent via the same optical waveguide, with each optical wavelength corresponding to an oscillation frequency of the electromagnetic field present in the waveguide. Another way to make use of a large optical bandwidth consists in applying a wide-band modulation to a single optical wavelength. The OFDM corresponds to this type of modulation wherein several electrical sub-carriers that have different frequencies are modulated individually by different signals in baseband then combined and transposed around the optical frequency. A device 1000 such as described hereinabove can therefore correspond to such an electro-optical emitting-receiving device of the OFDM type using the sub-carriers of different frequencies. Each one of these frequencies is in this case modulated with a different flow of data then transposed into frequency in the optical field using a modulator or a laser in order to provide an OFDM optical signal.

What is claimed is:

1. A device for emitting and/or receiving signals in at least two symmetrical frequency bands in relation to a first central frequency of symmetry $F_{CA}$ and such that each one of the at least two frequency bands comprises at least two channels, or groups of channels, symmetrical in relation to second central frequencies of symmetry, including a central lower frequency $F_{CLA}$, and a central upper frequency $F_{CUA}$, said device comprising at least:

a first circuitry able to generate a periodic signal of frequency $F_A$, a periodic signal of frequency $F_B=F_A/N1$, a periodic signal of frequency $F_1$ equal to $|F_{CA}-F_{CLA}|$ and a periodic signal of frequency $F_2$ equal to the difference between a central frequency of one of the at least two channels or groups of channels and the second frequency of symmetry associated with said one of the at least two channels or groups of channels, and wherein $F_A=N1\cdot(F_{CLA}+F_1)/(N1+1)$ with N1 being a number greater than 1;

a second circuitry able to carry out a first non-linear operation between the periodic signals of frequencies $F_A$ and $F_1$ generating a first multitone signal of which the frequency spectrum comprises two main lines at frequencies $F_A-F_1$ and $F_A+F_1$, and able to carry out a second non-linear operation between the periodic signals of frequencies $F_B$ and $F_2$ generating a second multitone signal of which the frequency spectrum comprises two main lines at frequencies $F_B-F_2$ and $F_B+F_2$.

2. The device according to claim 1, wherein the second circuitry comprises at least one first mixer able to carry out the first non-linear operation and a second mixer able to carry out the second non-linear operation.

3. The device according to claim 1, wherein the first circuitry comprises a first phase locked loop able to output the periodic signals of frequencies $F_A$ and $F_B$ and a second phase locked loop able to output the periodic signals of frequencies $F_1$ and $F_2$, or, when the frequency $F_A$ corresponds to an integer multiple of each one of the frequencies $F_B$, $F_1$ and $F_2$, the first circuitry comprises a single phase locked loop able to output the periodic signals of frequencies $F_A$, $F_B$, $F_1$ and $F_2$.

4. The device according to claim 1, further comprising at least:
 first and second frequency recovery circuits receiving as input the first multitone signal and each one outputting a periodic signal respectively of frequency $F_A-F_1$ and $F_A+F_1$;
 third and fourth frequency recovery circuits receiving as input the second multitone signal and each one outputting a periodic signal respectively of frequency $F_B-F_2$ and $F_B+F_2$.

5. The device according to claim 4, further comprising, when each one of the at least two frequency bands comprises at least two groups of at least two channels, a third circuitry able to perform a third non-linear operation between the periodic signal of frequency $F_B-F_2$ and a periodic signal of frequency $F_3$ generating a third multitone signal of which the frequency spectrum comprises two main lines at frequencies $F_B-F_2-F_3$ and $F_B-F_2+F_3$, and able to perform a fourth non-linear operation between the periodic signals of frequencies $F_B+F_2$ and $F_3$ generating a fourth multitone signal of which the frequency spectrum comprises two main lines at frequencies $F_B+F_2-F_3$ and $F_B+F_2+F_3$.

6. The device according to claim 5, further comprising at least:
 fifth and sixth frequency recovery circuits receiving as input the third multitone signal and each one outputting a periodic signal respectively of frequency $F_B-F_2-F_3$ and $F_B-F_2+F_3$;
 seventh and eighth frequency recovery circuits receiving as input the fourth multitone signal and each one outputting a periodic signal of frequency $F_B+F_2-F_3$ and $F_B+F_2+F_3$.

7. The device according to claim 4, wherein each frequency recovery circuit comprises at least one injection locked oscillator and/or a bandpass filter.

8. The device according to claim 1, further comprising:
 first and second frequency recovery circuits receiving as input the first multitone signal and each one outputting a periodic signal respectively of frequency $F_A-F_1$ and $F_A+F_1$;
 a fourth circuitry able to perform a third non-linear operation between the second multitone signal and a periodic signal of frequency $F_3$ generating a fifth multitone signal of which the spectrum comprises four main lines at the frequencies $F_B-F_2-F_3$, $F_B-F_2+F_3$, $F_B+F_2-F_3$ and $F_B+F_2+F_3$;
 at least one switchable injection locked oscillator receiving as input the fifth multitone signal and outputting at least one periodic signal of frequency equal to one of the frequencies $F_B-F_2-F_3$, $F_B-F_2+F_3$, $F_B+F_2-F_3$ and $F_B+F_2+F_3$.

9. The device according to claim 1, further comprising:
 a conversion stage between the frequency bands and an intermediate frequency band, comprising at least one third mixer able to receive as input a signal received by the device in one of the at least two frequency bands and one of the two periodic signals of frequencies $F_A-F_1$ and $F_A+F_1$ and at least one fourth mixer able to receive as input an intermediate frequency band signal intended to be emitted by the device in the other of the at least two frequency bands and the other of the two periodic signals of frequencies $F_A-F_1$ and $F_A+F_1$;
 a conversion stage between the intermediate frequency band and a baseband, comprising a plurality of fifth mixers each able to receive as input an output signal of the third mixer and one of the periodic signals of frequencies $F_B-F_2$, $F_B+F_2$, $F_B-F_2-F_3$, $F_B-F_2+F_3$, $F_B+F_2-F_3$ and $F_B+F_2+F_3$, and a plurality of sixth mixers each able to receive as input a signal in baseband intended to be emitted by the device in said other of the at least two frequency bands and one of the periodic signals of frequencies $F_B-F_2$, $F_B+F_2$, $F_B-F_2-F_3$, $F_B-F_2+F_3$, $F_B+F_2-F_3$ and $F_B+F_2+F_3$, with $F_3$ being a frequency of a periodic signal.

10. A method for emitting and/or receiving signals in at least two symmetrical frequency bands in relation to a first central frequency of symmetry $F_{CA}$ and such that each one of the at least two frequency bands comprises at least two channels, or groups of channels, symmetrical in relation to second central frequencies of symmetry, including a central lower frequency $F_{CA}$, and a central upper frequency $F_{CUA}$, comprising at least the steps of:
 generating a periodic signal of frequency $F_A$, of a periodic signal of frequency $F_B=F_A/N1$, of a periodic signal of frequency $F_1$ equal to $|F_{CA}-F_{CLA}|$ and of a periodic signal of frequency $F_2$ equal to the difference between a central frequency of one of the at least two channels or group of channels and the second frequency of symmetry
associated with said one of the at least two channels or group of channels, and wherein $F_A=N1\cdot(F_{CLA}+F_1)/(N1+1)$ with N1 being a number greater than 1;
 performing of a first non-linear operation between the periodic signals of frequencies $F_A$ and $F_1$ generating a first multitone signal of which the frequency spectrum comprises two main lines at frequencies $F_A-F_1$ and $F_A+F_1$, and a second non-linear operation between the periodic signals of frequency $F_B$ and $F_2$ generating a second multitone signal of which the frequency spectrum comprises two main lines at frequencies $F_B-F_2$ and $F_B+F_2$.

11. The method according to claim 10, further comprising the steps of:
 generating periodic signals of frequencies $F_A-F_1$ and $F_A+F_1$ using the first multitone signal;
 generating periodic signals of frequencies $F_B-F_2$ and $F_B+F_2$ using the second multitone signal.

12. The method according to claim 11, further comprising, when each one of the at least two frequency bands comprises at least two groups of at least two channels, the performing of a third non-linear operation between the periodic signal of frequency $F_B-F_2$ and a periodic signal of frequency $F_3$ generating a third multitone signal of which the frequency spectrum comprises two main lines at frequencies $F_B-F_2-F_3$ and $F_B-F_2+F_3$, and a fourth non-linear operation between the periodic signals of frequencies $F_B+F_2$ and $F_3$ generating a fourth multitone signal of which the spectrum comprises two main lines at frequencies $F_B+F_2-F_3$ and $F_B+F_2+F_3$.

13. The method according to claim 12, further comprising the steps of:
generating periodic signals of frequencies $F_B-F_2-F_3$ and $F_B-F_2+F_3$ using the third multitone signal;
generating periodic signals of frequencies $F_B+F_2-F_3$ and $F_B+F_2+F_3$ using the fourth multitone signal.

14. The method according to claim 10, further comprising the steps of:
generating periodic signals of frequencies $F_A-F_1$ and $F_A+F_1$ using the first multitone signal;
performing of a third non-linear operation between the second multitone signal and a periodic signal of frequency $F_3$ generating a fifth multitone signal of which the spectrum comprises four main lines at the frequencies $F_B-F_2-F_3$, $F_B-F_2+F_3$, $F_B+F_2-F_3$ and $F_B+F_2+F_3$;
generating of at least one periodic signal of frequency equal to one of the frequencies $F_B-F_2-F_3$, $F_B-F_2+F_3$, $F_B+F_2-F_3$ and $F_B+F_2+F_3$ using the fifth multitone signal.

15. The method according to claim 10, further comprising:
during the receiving of a signal in one of the at least two frequency bands a first transposition in an intermediate frequency band of the signal received using one of the two periodic signals of frequencies $F_A-F_1$ and $F_A+F_1$, then a second transposition in baseband of the signal coming from the first transposition using one of the periodic signals of frequencies $F_B-F_2$, $F_B+F_2$, $F_B-F_2-F_3$, $F_B-F_2+F_3$, $F_B+F_2-F_3$ and $F_B+F_2+F_3$, with $F_3$ being a frequency of a periodic signal, and
during the emitting of a signal in the other of the at least two frequency bands, a first transposition in the intermediate frequency band of a signal in baseband using one of the periodic signals of frequencies $F_B-F_2$, $F_B+F_2$, $F_B-F_2-F_3$, $F_B-F_2+F_3$, $F_B+F_2-F_3$ and $F_B+F_2+F_3$, then a second transposition in the other of the at least two frequency bands of the signal coming from the first transposition using the other of the two periodic signals of frequencies $F_A-F_1$ and $F_A+F_1$.

* * * * *